(12) United States Patent
Cotorogea et al.

(10) Patent No.: US 8,853,774 B2
(45) Date of Patent: Oct. 7, 2014

(54) SEMICONDUCTOR DEVICE INCLUDING TRENCHES AND METHOD OF MANUFACTURING A SEMICONDUCTOR DEVICE

(71) Applicant: Infineon Technologies AG, Neubiberg (DE)

(72) Inventors: Maria Cotorogea, Taufkirchen (DE); Hans Peter Felsl, München (DE); Yvonne Gawlina, Pullach (DE); Francisco Javier Santos Rodriguez, Villach (AT); Hans-Joachim Schulze, Taufkirchen (DE); Georg Seibert, Waakirchen (DE); Andre Rainer Stegner, München (DE); Wolfgang Wagner, Villach (AT)

(73) Assignee: Infineon Technologies AG, Neubiberg (DE)

( * ) Notice: Subject to any disclaimer, the term of this patent is extended or adjusted under 35 U.S.C. 154(b) by 19 days.

(21) Appl. No.: 13/690,328

(22) Filed: Nov. 30, 2012

(65) Prior Publication Data
US 2014/0151789 A1    Jun. 5, 2014

(51) Int. Cl.
*H01L 29/66* (2006.01)
*H01L 21/8234* (2006.01)
*H01L 27/088* (2006.01)

(52) U.S. Cl.
CPC .................. *H01L 27/088* (2013.01); *H01L 21/823481* (2013.01)

USPC .... 257/330; 257/331; 257/332; 257/E29.262; 438/270; 438/272; 438/589

(58) Field of Classification Search
USPC .......... 257/330–334, E29.262; 438/270, 272, 438/589
See application file for complete search history.

(56) References Cited

U.S. PATENT DOCUMENTS

| | | | |
|---|---|---|---|
| 5,623,152 A | 4/1997 | Majumdar et al. | |
| 5,894,149 A | 4/1999 | Uenishi et al. | |
| 7,514,743 B2 * | 4/2009 | Yang | 257/330 |
| 8,264,033 B2 | 9/2012 | Pfirsch et al. | |
| 8,629,505 B2 * | 1/2014 | Nishiwaki | 257/367 |
| 2003/0042537 A1 * | 3/2003 | Nakamura et al. | 257/328 |
| 2006/0214222 A1 | 9/2006 | Challa et al. | |

* cited by examiner

*Primary Examiner* — Matthew W Such
*Assistant Examiner* — Scott Stowe
(74) *Attorney, Agent, or Firm* — Murphy, Bilak & Homiller, PLLC

(57) ABSTRACT

A semiconductor device includes a first transistor cell including a first gate electrode in a first trench. The semiconductor device further includes a second transistor cell including a second gate electrode in a second trench, wherein the first and second gate electrodes are electrically connected. The semiconductor device further includes a third trench between the first and second trenches, wherein the third trench extends deeper into a semiconductor body from a first side of the semiconductor body than the first and second trenches. The semiconductor device further includes a dielectric in the third trench covering a bottom side and walls of the third trench.

25 Claims, 13 Drawing Sheets

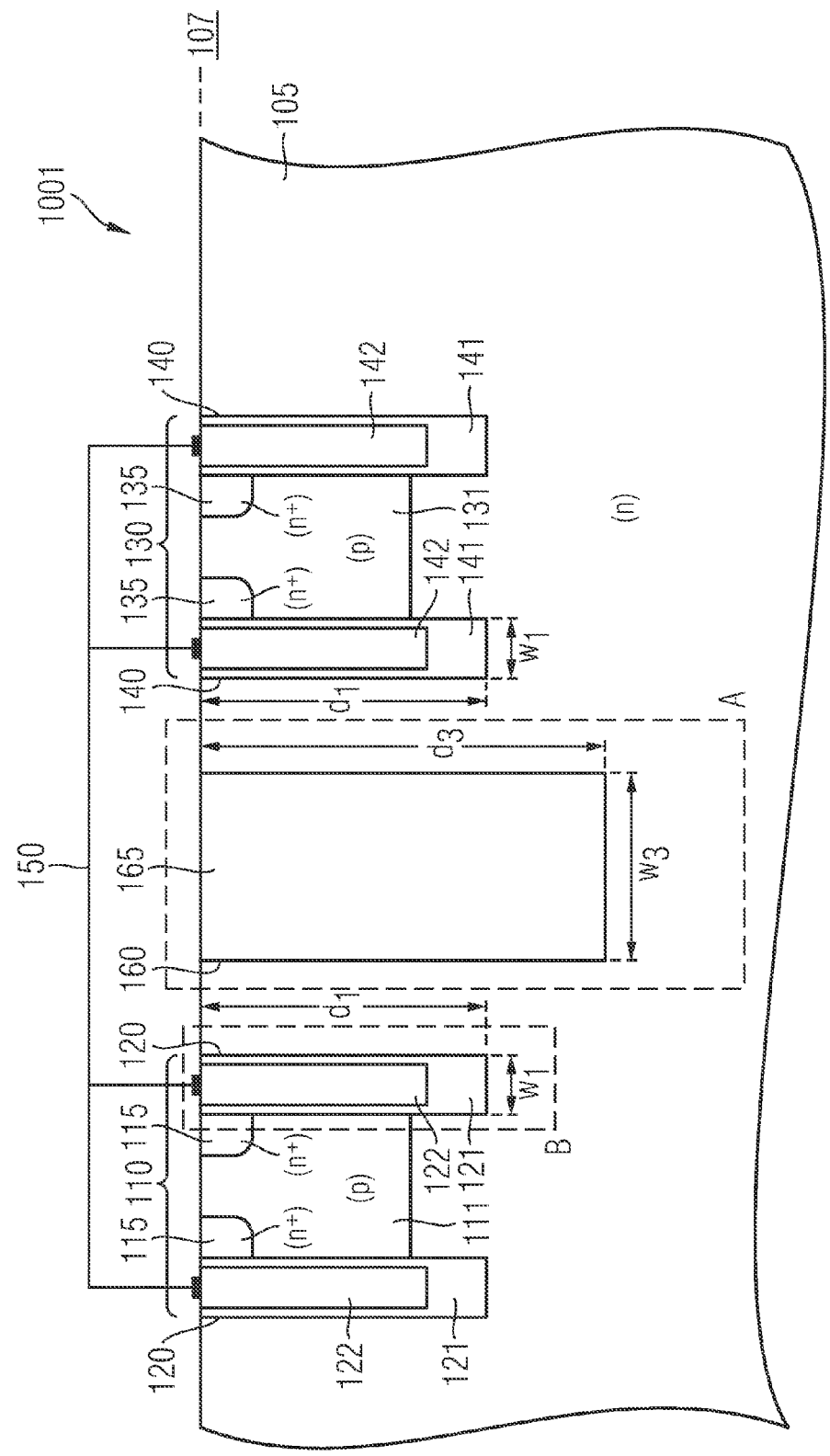

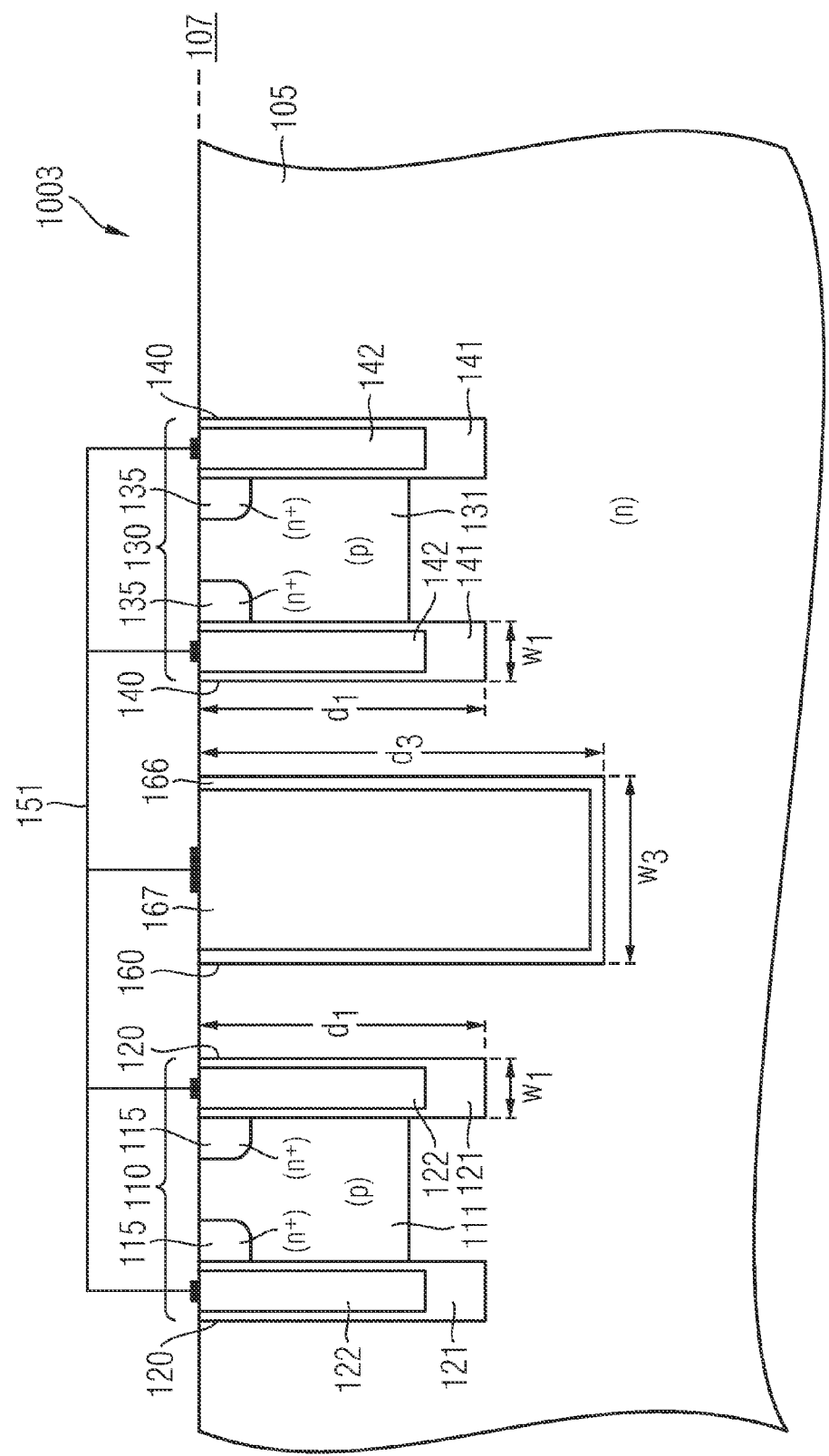

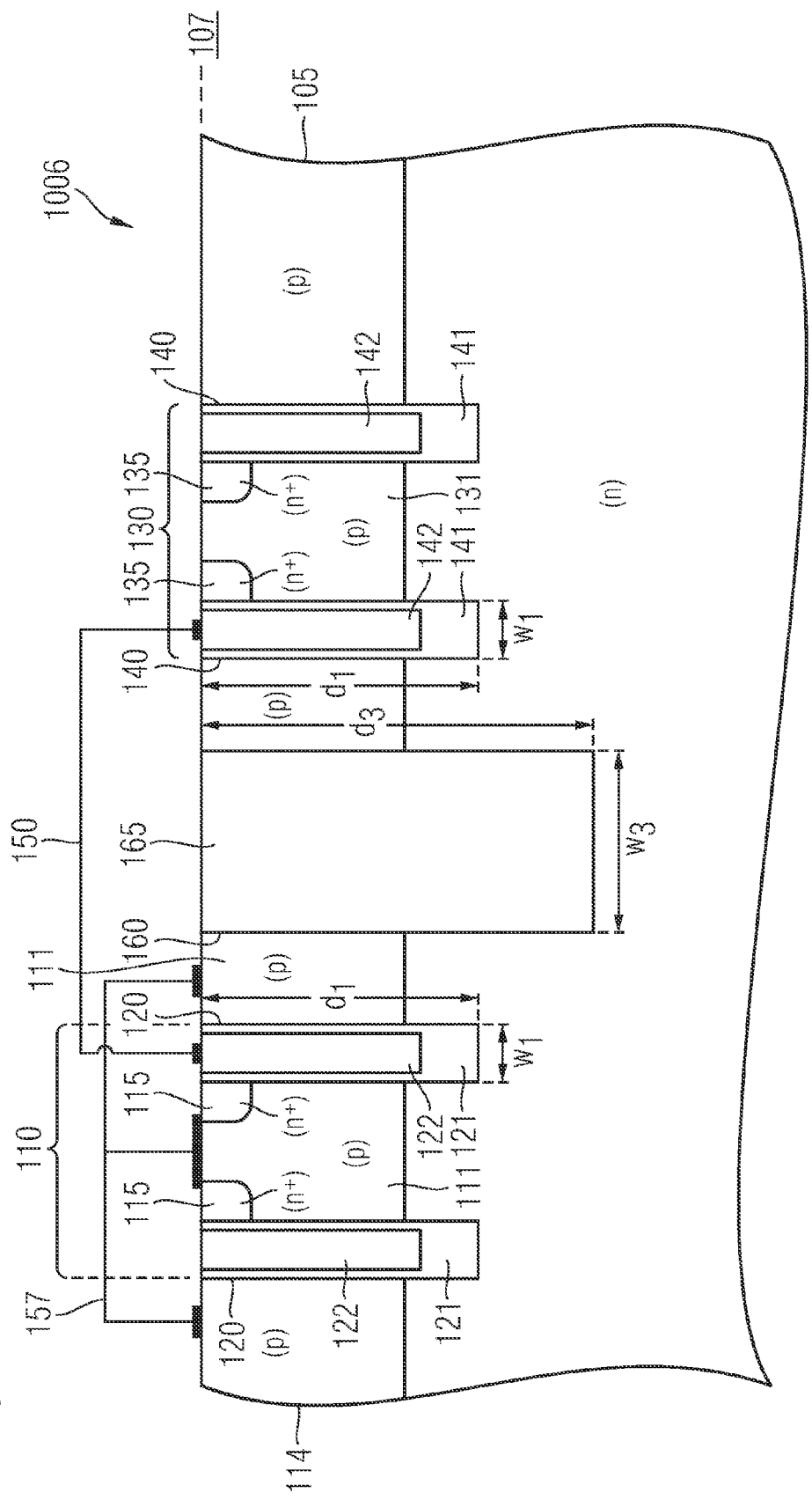

SEMICONDUCTOR DEVICE INCLUDING TRENCHES AND METHOD OF MANUFACTURING A SEMICONDUCTOR DEVICE

BACKGROUND

Semiconductor devices such as Field Effect Transistors (FETs) and Insulated Gate Bipolar Transistors (IGBTs) are widely used in a broad range of applications, e.g. automotive and industrial. When switching loads by these semiconductor devices undesired oscillations in electrical characteristics such as oscillations of a collector-emitter voltage of an IGBT may emerge. It is desirable to provide a semiconductor device that allows for reducing or suppressing oscillations during switching of loads. Furthermore, it is desirable to provide a method or manufacturing the semiconductor device.

SUMMARY

According to an embodiment of a semiconductor device, the semiconductor device includes a first transistor cell including a first gate electrode in a first trench. The semiconductor device further includes a second transistor cell including a second gate electrode in a second trench. The first and second gate electrodes are electrically connected. The semiconductor device further includes a third trench between the first and second trenches. The third trench extends deeper into a semiconductor body from a first side of the semiconductor body than the first and second trenches. The semiconductor device further includes a dielectric in the third trench covering a bottom side and walls of the third trench.

According to a method of manufacturing an embodiment of a semiconductor device, the method includes forming a first transistor cell including a first gate electrode in a first trench. The method further includes forming a second transistor cell including a second gate electrode in a second trench. The method further includes electrically connecting the first and second gate electrodes. The method further includes forming a third trench between the first and second trenches, wherein the third trench extends deeper into a semiconductor body from a first side of the semiconductor body than the first and second trenches. The method further includes forming a dielectric in the third trench covering a bottom side and sidewalls of the third trench.

Those skilled in the art will recognize additional features and advantages upon reading the following description, and upon viewing the accompanying drawings.

BRIEF DESCRIPTION OF THE DRAWINGS

The accompanying drawings are included to provide a further understanding of the present invention and are incorporated in and constitute a part of the specification. The drawings illustrate embodiments of the present invention and together with the description the intended advantages will be readily appreciated as they become better understood by reference to the following detailed description. The elements of the drawings are not necessarily to scale relative to each other. Like reference numerals designate corresponding similar parts.

FIGS. 1A to 1G illustrate cross-sectional views of embodiments of a semiconductor device including gate trench transistor cells and a third trench between two of the transistor cells.

DETAILED DESCRIPTION

Figure 1B:
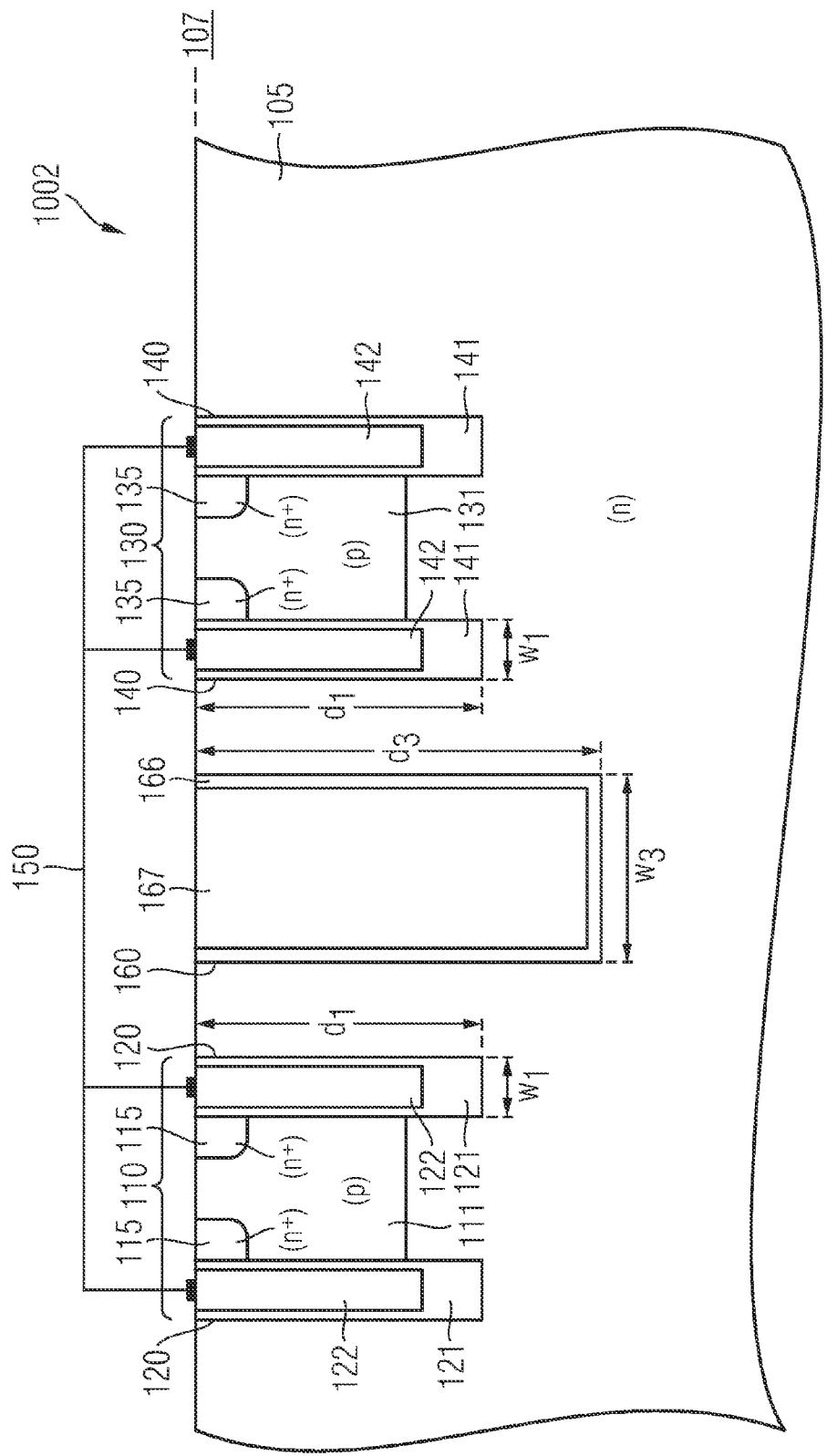

In the following detailed description reference is made to the accompanying drawings, which form a part hereof, and in which are shown by way of illustration specific embodiments in which the invention may be practiced. It is to be understood that other embodiments may be utilized and structural or logical changes may be made without departing from the scope of the present invention. For example features illustrated or described for one embodiment can be used on or in conjunction with other embodiments to yield yet a further embodiment. It is intended that the present invention include such modifications and variations. The examples are described using specific language, which should not be construed as limiting the scope of the appending claim. The drawings are not scaled and are for illustrative purposes only. For clarity, corresponding elements have been designated by the same references in the different drawings if not stated otherwise.

The terms "having", "containing", "including", "comprising" and the like are open and the terms indicate the presence of stated structures, elements or features but not preclude additional elements or features. The articles "a", "an" and "the" are intended to include the plural as well as the singular, unless the context clearly indicates otherwise.

Further, terms such as "first", "second", and the like, are also used to describe various elements, regions, sections, etc. and are also not intended to be limiting. Like terms refer to like elements throughout the description.

The Figures illustrate relative doping concentrations by indicating "−" or "+" next to the doping type "n" or "p". For example, "n−" means a doping concentration which is lower than the doping concentration of an "n"-doping region while an "n+"-doping region has a higher doping concentration than an "n"-doping region. Doping regions of the same relative doping concentration do not necessarily have the same absolute doping concentration. For example, two different "n"-doping regions may have the same or different absolute doping concentrations.

The term "electrically connected" describes a permanent low-ohmic connection between electrically connected elements, for example a direct contact between the concerned elements or a low-ohmic connection via a metal and/or highly doped semiconductor.

The term "electrically coupled" includes that one or more intervening element(s) adapted for signal transmission may be provided between the electrically coupled elements, for example elements that are controllable to temporarily provide a low-ohmic connection in a first state and a high-ohmic electric decoupling in a second state.

FIGS. 1A to 1G illustrate cross-sectional views of embodiments of semiconductor devices 1001 . . . 1007 including a first transistor cell 110, a second transistor cell 130, and a third trench 160 between the first and second transistor cells 110, 130.

Referring to the schematic cross-sectional view of the semiconductor device 1001 illustrated in FIG. 1A, the first transistor cell 110 includes a first body region 111 of a second conductivity type in a semiconductor body 105 of a first conductivity type complementary to the second conductivity type. In one embodiment, the semiconductor body 105 includes a semiconductor substrate, e.g. a silicon (Si) substrate, a silicon carbide (SiC) substrate or other single semiconductor or compound semiconductor substrate and one or more optional semiconductor layers thereon. First source regions 115 of the first conductivity type adjoin first trenches 120. Each one of the first trenches 120 includes a first gate electrode 122 electrically isolated from a surrounding part of the semiconductor body 105 by a first dielectric structure 121.

Similar to the first transistor cell 110, the second transistor cell 130 includes a second body region 131 of the second conductivity type in the semiconductor body 105. Second source regions 135 of the first conductivity type adjoin second trenches 140. Each one of the second trenches 140 includes a second gate electrode 142 electrically isolated from a surrounding part of the semiconductor body 105 by a second dielectric structure 141.

Similar elements of the first and second transistor cells 110, 130 may be processed together. As an example, the first and second source regions 115, 135 may be formed together, e.g. by ion implantation. Likewise, the first and second dielectric structures 121, 141 may be formed together. The first and second trenches 120, 140 may be formed together and also the first and second gate electrodes 122 and 142 may be formed together.

The first and second trenches 120, 140 extend from a first side 107, e.g. a front side of the semiconductor body 105 into the semiconductor body 105. Each one of the first and second trenches 120, 140 has a depth of $d_1$ and a width of $w_1$. The third trench 160 is located between the first and second transistor cells 110, 130 and has a depth of $d_3$ and a width of $w_3$. The depth $d_3$ is larger than the depth $d_1$. The third trench 160 lacks any gate structure including a threshold voltage similar to the first and second trenches 120, 140.

As the third trench 160 extends deeper into the semiconductor body 105, highest values of a dynamic electric field, e.g. during dynamic avalanche breakdown can be shifted away from the first and second trenches 120, 140 to an area around the third trench 160, e.g. to a bottom side of the third trench 160. Thereby, undesired drifting of characteristic parameters of the semiconductor device 1001, e.g. threshold voltage or switching speed can be suppressed or counteracted since hot carrier injection into a gate oxide in the first and second trenches 120, 140 is reduced or suppressed. Furthermore, undesired oscillations during switching operation can be suppressed or reduced.

In one embodiment the width $w_3$ of the third trench 160 is greater than the width $w_1$. The third trench 160 may be processed, e.g. etched together with the first and second trenches 120, 140 of the first and second transistor cells 110, 130. By adjusting $w_3 > w_1$, a same etch process for manufacturing the first to third trenches 120, 140, 160 may automatically result in $d_3 > d_1$. Thereby, separate lithographic processes and separate etch processes for manufacturing the first and second trenches 120, 140 and the third trench 160 can be avoided. In one embodiment the width $w_3$ is 0.2 μm greater than $w_1$ in order to make $d_3$ greater, e.g. 0.5 μm greater than $d_1$. As an example, the width $w_1$ may be equal to 1 μm and the depth $d_1$ may be equal to 5 μm. In one embodiment, the width $w_1$ ranges between $0.05 \times w_3$ and $w_3$, in particular between $0.7 \times w_3$ and $0.9 \times w_3$.

In one embodiment the depth $d_3$ of the third trench 160 ranges between $d_1 + 0.5$ μm and $d_1 + 4$ μm. In another embodiment, the depth $d_3$ of the third trench 160 ranges between $d_1 + 0.5$ μm and $d_1 + 2$ μm.

In one embodiment the width of the depth $d_1$ of the trenches 120, 140 ranges between 1 μm and 8 μm.

The first and second transistor cells 110, 130 are cells of a transistor cell array. In one embodiment the first and second gate electrodes 122, 142 are electrically connected by an electric connection 150. The electric connection 150 may include any low-ohmic materials, e.g. a metal or a highly doped semiconductor or a combination thereof. As an example, the electric connection 150 may be part of a wiring area including wiring levels, interlevel dielectrics, contact plugs/lines and vias. Likewise, the first and second source regions 115, 135 may be electrically connected together, e.g. to a source line.

In the embodiment illustrated in FIG. 1A the third trench 160 is filled with a dielectric 165. The dielectric 165 may include one or a plurality of dielectric materials, e.g. oxides and/or nitrides such as $SiO_2$ and $Si_3N_4$. Thereby, the third trench 160 can be stabilized. Further benefits include simplicity of process, improved long-term stability due to dielectric 165 and suppression of increase of reverse transfer capacitance.

According to one embodiment the semiconductor device 1001 illustrated in FIG. 1A or any of the semiconductor devices described with reference to the further embodiments described below is a discrete semiconductor device, e.g. an FET such as a Metal Oxide Semiconductor FET (MOSFET) or an IGBT. According to another embodiment, the semiconductor device 1001 illustrated in FIG. 1A or any of the semiconductor devices described with reference to the further embodiments described below is part of an integrated circuit.

FIG. 1B illustrates a schematic cross-sectional of a semiconductor device 1002. Same components of the semiconductor devices 1001 (FIG. 1A) and 1002 (FIG. 1B) are denoted by same reference numerals. Unlike the semiconductor device 1001 illustrated in FIG. 1A, the third trench 160 is filled with a dielectric 166 lining sidewalls and a bottom side of the third trench 160 and a conductive material 167 adjoining the third dielectric 166. The conductive material 167 may include a metal, a highly doped semiconductor or a combination thereof. In the embodiment illustrated in FIG. 1B, the conductive material 167 is floating. In other words, the conductive material 167 is disconnected from any presettable electric potential. Benefits of the illustrated embodiment include simplicity of process, improved long-term stability due to suppression of degradation, suppression of increase of reverse transfer capacitance, and suppression of impact on switching behavior due to lack of electrical contact to source and/or gate.

FIG. 1C illustrates a schematic cross-sectional of a semiconductor device 1003. Same components of the semiconductor devices 1001 (FIG. 1A) and 1003 (FIG. 1C) are denoted by same reference numerals. Unlike the semiconductor device 1001 illustrated in FIG. 1A, the third trench 160 is filled with a dielectric 166 lining sidewalls and a bottom side of the third trench 160 and a conductive material 167 adjoining the dielectric 166. The conductive material 167 may include a metal, a highly doped semiconductor or a combination thereof. In the embodiment illustrated in FIG. 1C, the conductive material 167 is electrically connected to the first and second gate electrodes 122, 142 by an electrical connection 151. The electrical connection 151 may include any low-ohmic materials, e.g. a metal or a highly doped semiconductor or a combination thereof. As an example, the electric connection 151 may be part of a wiring area including wiring levels, interlevel dielectrics, contact plugs/lines and vias.

By adjusting a thickness of the dielectric 166 in the third trench 160 greater than a corresponding thickness, e.g. thickness at a same vertical level of the first and second dielectric structures 121, 141 in the first and second trenches 120, 140, the third trench 160 can be stabilized and a reverse transfer capacitance can be reduced. Benefits of the illustrated embodiment include simplicity of process, optional increase of gate capacitance e.g. for controlling switching speed via gate resistor.

Figure 1D:
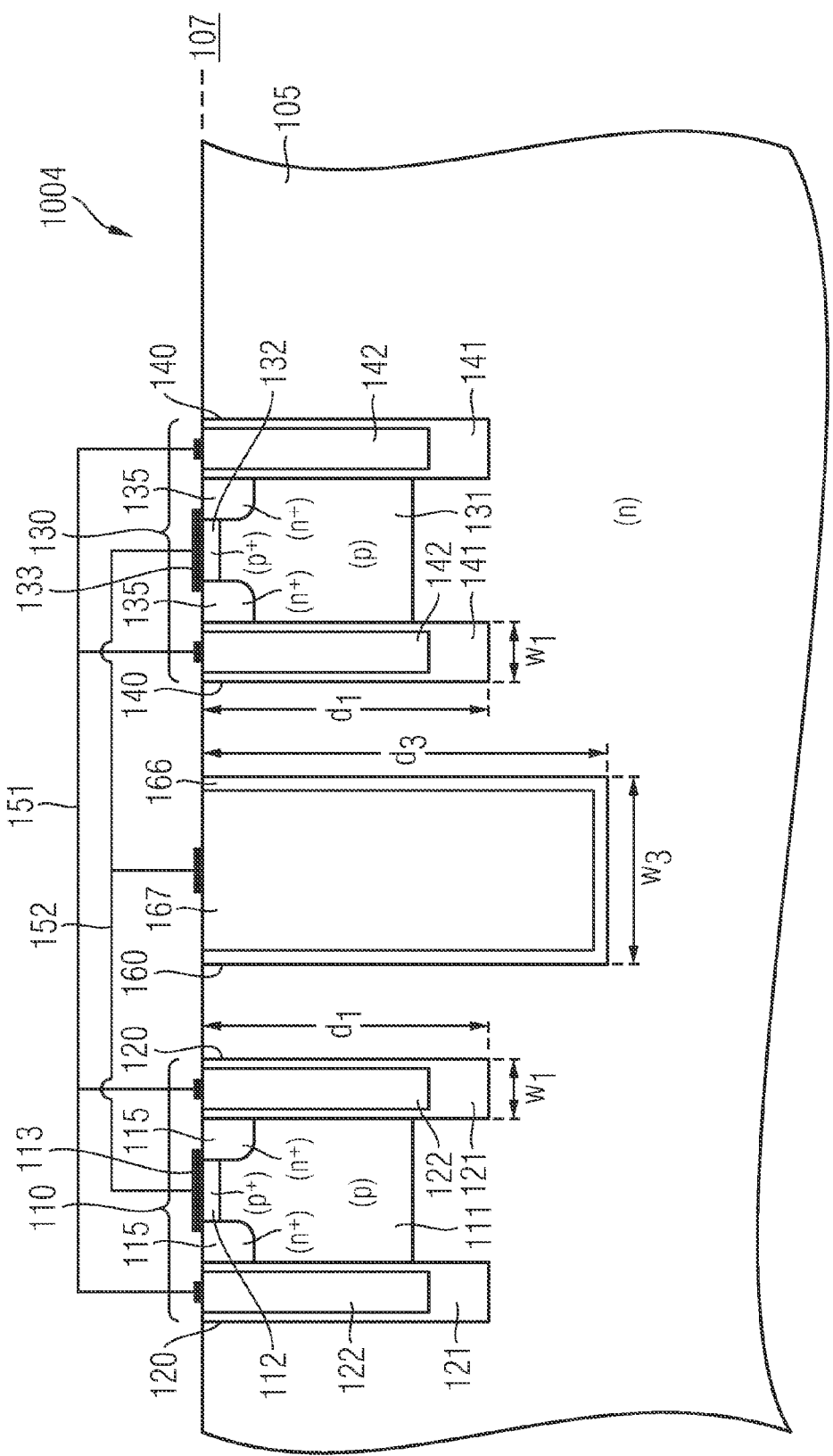

FIG. 1D illustrates a schematic cross-sectional of a semiconductor device 1004. Same components of the semiconductor devices 1001 (FIG. 1A) and 1004 (FIG. 1D) are denoted by same reference numerals. Unlike the semiconductor device 1001 illustrated in FIG. 1A, the third trench 160 is filled with a dielectric 166 lining sidewalls and a bottom side of the third trench 160 and a conductive material 167 adjoining the dielectric 166. The conductive material 167 may include a metal, a highly doped semiconductor or a combination thereof. In the embodiment illustrated in FIG. 1D, the conductive material 167 is electrically connected to the first and second source regions 115, 135 by an electrical connection 152. The electrical connection 152 may include any low-ohmic materials, e.g. a metal or a highly doped semiconductor or a combination thereof. As an example, the electric connection 152 may be part of a wiring area including wiring levels, interlevel dielectrics, contact plugs/lines and vias. Furthermore, the electrical connection 152 may also provide an electrical contact to the body regions 111, 131 by highly doped body contact regions 112, 132.

By adjusting a thickness of the dielectric 166 in the third trench 160 greater than a corresponding thickness, e.g. thickness at a same vertical level of the first and second dielectric structures 121, 141 in the first and second trenches 120, 140 the third trench 160 can be stabilized and a reverse transfer capacitance can be reduced.

Figure 1E:
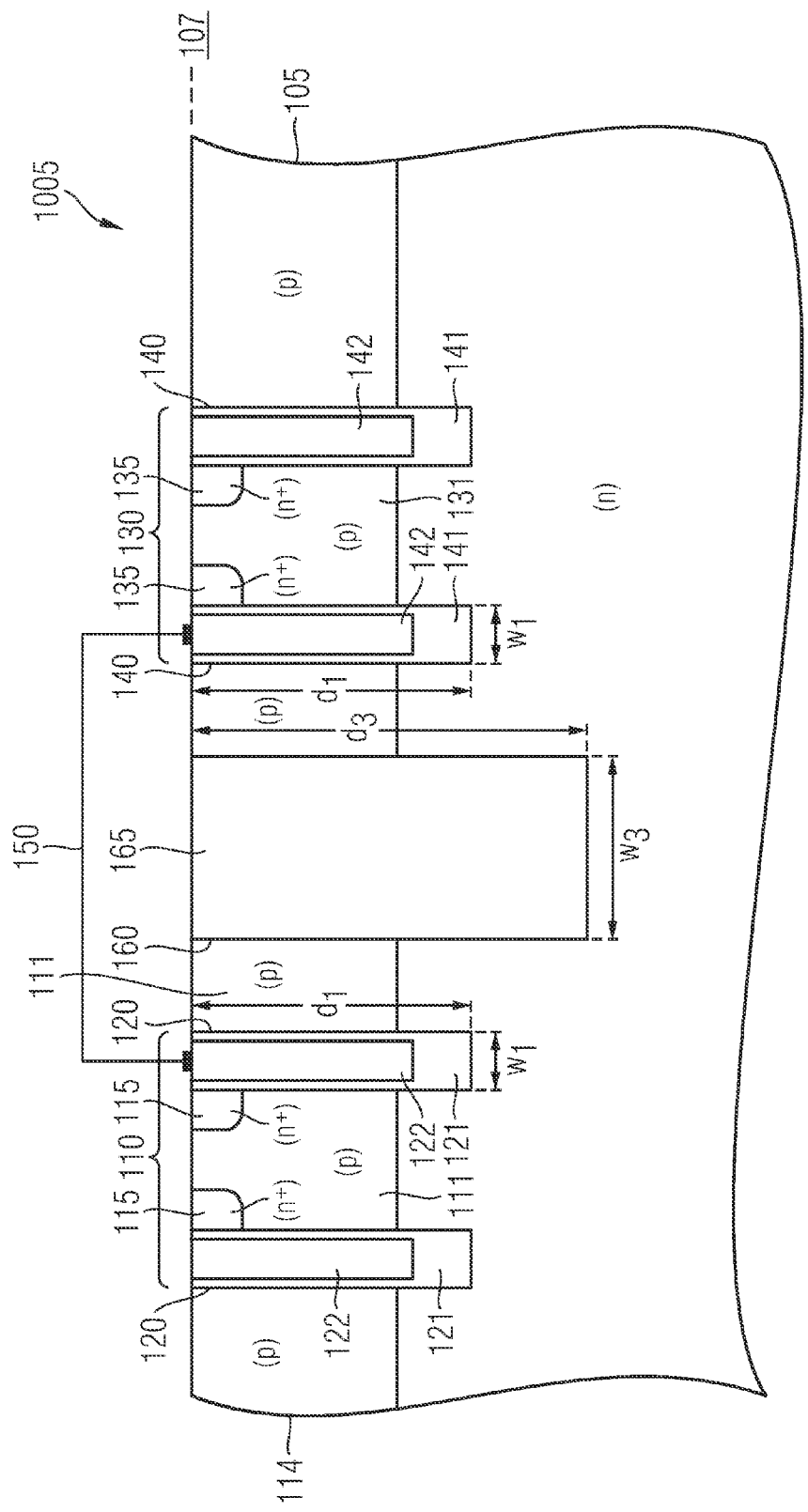

FIG. 1E illustrates a schematic cross-sectional of a semiconductor device 1005. Same components of the semiconductor devices 1001 (FIG. 1A) and 1005 (FIG. 1E) are denoted by same reference numerals. Unlike the semiconductor device 1001 illustrated in FIG. 1A, the first and second body regions 111, 131 also adjoin the third trench 160. Arrangement of the first and second body regions 111, 131 as illustrated in FIG. 1E can also be combined with the embodiments illustrated in FIGS. 1A to 1D.

The embodiment illustrated in FIG. 1E allows for a simplification of process by saving of a lithography mask.

FIG. 1F illustrates a schematic cross-sectional of a semiconductor device 1006. Same components of the semiconductor devices 1001 (FIG. 1A) and 1006 (FIG. 1F) are denoted by same reference numerals. Unlike the semiconductor device 1001 illustrated in FIG. 1A, the first and second body regions 111, 131 also adjoin the third trench 160. Arrangement of the first and second body regions 111, 131 as illustrated in FIG. 1F can also be combined with the embodiments illustrated in FIGS. 1A to 1E.

A part of the first body region 111 adjoining the third trench 160 is electrically coupled to the first source region 115 via a connection 157. In the embodiment illustrated in FIG. 1F, the first and second body regions 111, 131 adjoin the third trench 160 whereas merely a respective part of the first body region 111 is electrically coupled to the first source region 115. In other words, according to one embodiment, only some of parts of the first and second body regions 111, 131 adjoining the third trench 160 are electrically coupled to the first and second source regions 115, 135. The embodiment illustrated in FIG. 1F allows for an additional discharge path for holes in the part of the first body region 111 adjoining the third trench 160.

Figure 1G:
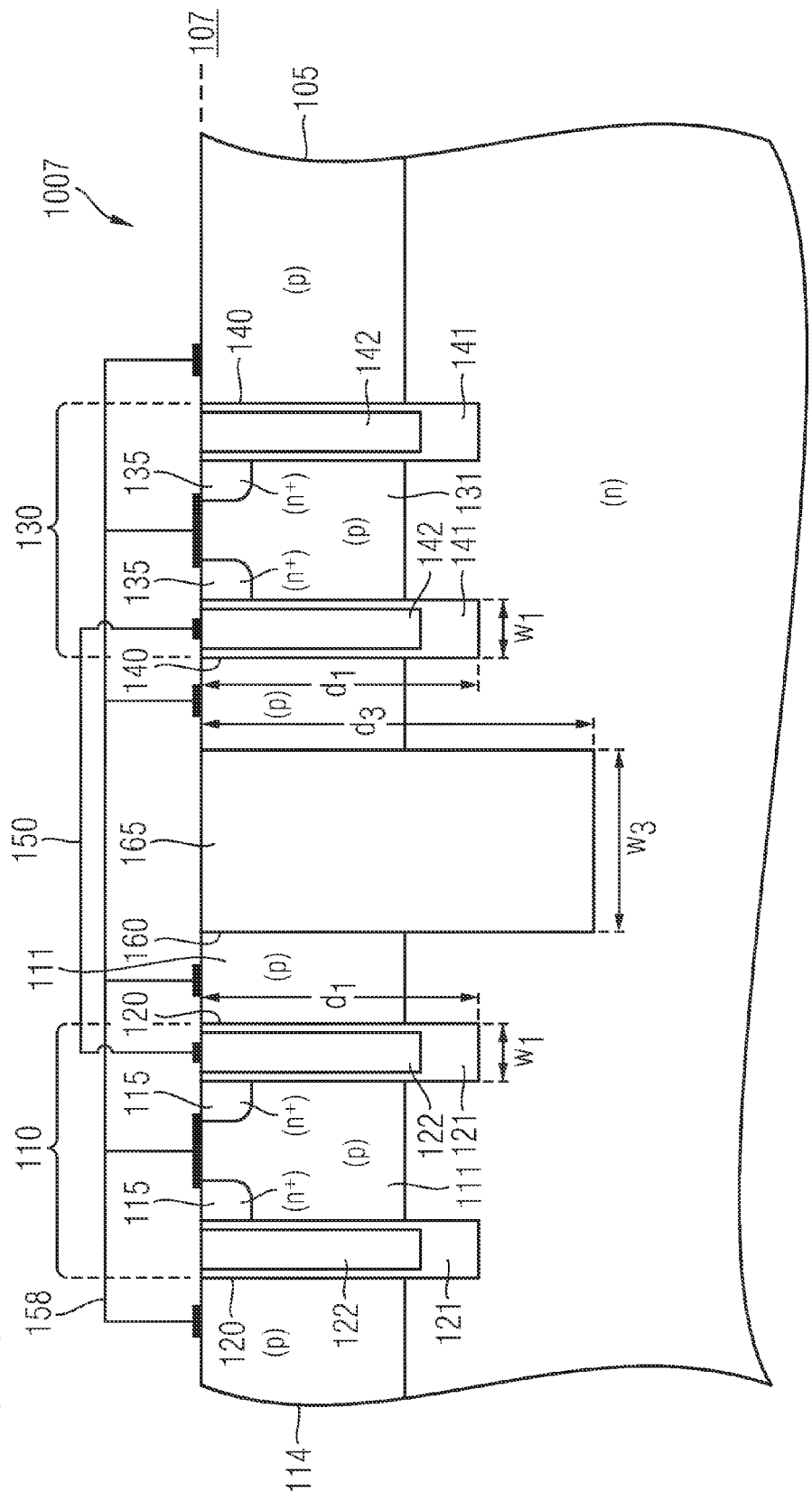

FIG. 1G illustrates a schematic cross-sectional of a semiconductor device 1007. Same components of the semiconductor devices 1001 (FIG. 1A) and 1007 (FIG. 1G) are denoted by same reference numerals. Unlike the semiconductor device 1001 illustrated in FIG. 1A, the first and second body regions 111, 131 also adjoin the third trench 160. Arrangement of the first and second body regions 111, 131 as illustrated in FIG. 1G can also be combined with the embodiments illustrated in FIGS. 1A to 1E.

Parts of the first and second body regions 111, 131 adjoining the third trench 160 are electrically coupled to the first and second source regions 115, 135 via a connection 158. The embodiment illustrated in FIG. 1G allows for an additional discharge path for holes in the part of the first and second body regions 111, 131 adjoining the third trench 160.

Figure 2A:
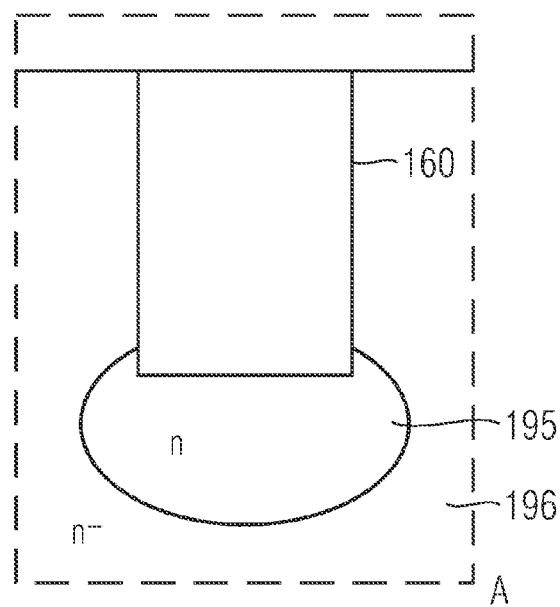
FIG. 2A illustrates a cross-sectional view of the third trench illustrated in any of FIGS. 1A to 1E and a doped region adjoining a bottom side of the third trench.
Figure 2B:
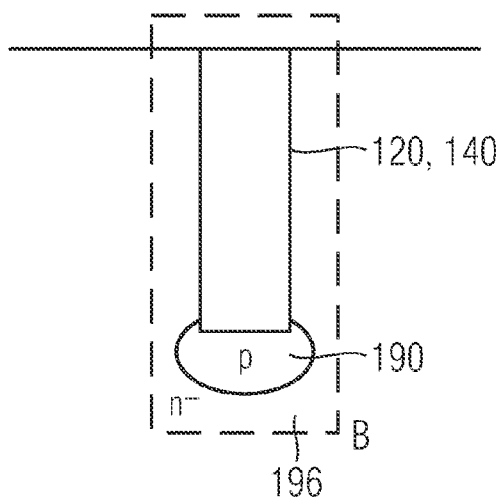
FIG. 2B illustrates a cross-sectional view of the first trench illustrated in any of FIGS. 1A to 1E and a doped region adjoining a bottom side of the first trench.

FIGS. 2A and 2B illustrate cross-sectional views of semiconductor devices according to embodiments, wherein concentration of dynamic avalanche at the bottom side of the third trench 160/first and second trenches 120, 140 is strengthened by introducing additional dopants at the bottom sides of these trenches.

FIG. 2A is a schematic illustration around the third trench 160 of FIGS. 1A to 1E and indicated by a border denoted A. The bottom side of the third trench 160 adjoins a first buried semiconductor region 195 of the first conductivity type including a net doping concentration higher than in a surrounding part of a drift zone 196. Arrangement of the buried semiconductor region 195 strengthens shifting dynamic avalanche from the first and second trenches 120, 140 to the third trench 160.

FIG. 2B is a schematic illustration around the first and second trenches 120, 140 of FIGS. 1A to 1E and indicated by a border denoted B. The bottom side of a first and second trenches 120, 140 adjoins a second buried semiconductor region 190 of the second conductivity type including a net doping concentration higher than in a surrounding part of the drift zone 196. Similar to the arrangement of the first buried semiconductor region 195, the second buried semiconductor region 190 strengthens shifting dynamic avalanche from the first and second trenches 120, 140 to the third trench 160.

In one embodiment the doping concentration of the drift zone 196 is less than $1 \times 10^{14}$ cm$^{-3}$ and the doping concentration of the first buried semiconductor region 195 exceeds $5 \times 10^{14}$ cm$^{-3}$.

In one embodiment the doping concentration of the drift zone 196 is less than $1 \times 10^{14}$ cm$^{-3}$ and the doping concentration of the second semiconductor region 190 exceeds $5 \times 10^{14}$ cm$^{-3}$.

The embodiments illustrated in FIGS. 2A and 2B may be combined with each other. The embodiments illustrated in FIGS. 2A and 2B may also be combined with any of the embodiments illustrated in FIGS. 1A to 1E.

Figure 3:
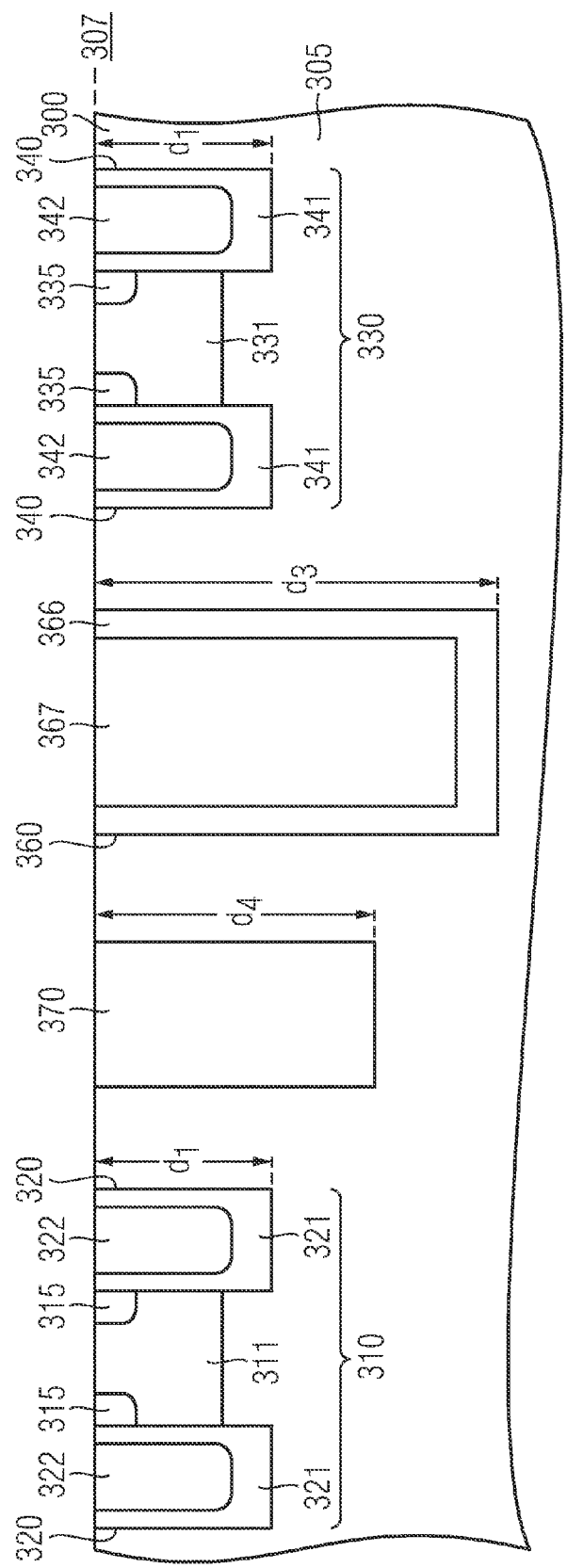
FIG. 3 illustrates a cross-sectional view of one embodiment of a semiconductor device including trench gate transistor cells and third to fifth trenches between two transistor cells of the trench gate transistor.

FIG. 3 illustrates one embodiment of a semiconductor device 300 including a fourth trench 370 between a first transistor cell 310 and a third trench 360.

Similar to respective elements of the semiconductor devices 1001 to 1005 illustrated in FIGS. 1A to 1E, the first transistor cell 310 includes first trenches 320, first source regions 315 of the first conductivity type and a first body region 311 of the second conductivity type. Each of the first trenches 320 includes a first gate electrode 322 electrically isolated from a surrounding part of a semiconductor body 305 by a first dielectric structure 321. Similar to the first transistor cell 310, a second transistor cell 330 includes second trenches 340, second source regions 335 of the first conductivity type and a second body region 331 of the second conductivity type. Each of the second trenches 340 includes a second gate electrode 342 electrically isolated from a surrounding part of the semiconductor body 305 by a second dielectric structure 341.

The fourth trench 370 and the third trench 360 are arranged between the first transistor cell 310 and the second transistor cell 330.

The first trenches 320 and the second trenches 340 extend into the semiconductor body 305 from a first side 307. A depth $d_1$ of the first and second trenches 320, 340 is smaller than depths $d_3$, $d_4$ of the third and fourth trenches 360, 370, respectively. The depth $d_4$ of the fourth trench 370 differs from the depth $d_3$ of the third trench 360.

The fourth trench 370 allows for optimization of an electric field distribution inside the semiconductor device 300 and thereby dynamic avalanche may be better shifted away from the first and second trenches 320, 340. A number and a pattern of arrangement of the third and fourth trenches 360, 370 and optional additional trenches between gate trenches in a cell array may be defined with respect to improved long-term stability by shifting dynamic avalanche from the first and second trenches 320, 340 to third and fourth trenches 360, 370, respectively.

The third trench 360 may include a conductive material 367 in addition to a third dielectric 366, but may also be filled with a dielectric material solely. The conductive material 367 may be one or a combination of an electrically floating material, a material electrically connected to the first and second gate electrodes 322, 342, and a material electrically connected to the first and second source regions 315, 335.

In one embodiment the fourth trench 370 is filled with a second conductive material. The second conductive material may be one or a combination of an electrically floating material, a material electrically connected to the first and second gate electrodes 322, 342, and a material electrically connected to the first and second source regions 315, 335.

With regard to the details of the trenches 320, 340, and 360, the information of the embodiment described with reference to FIGS. 1A to 1E applies likewise.

Figure 4:
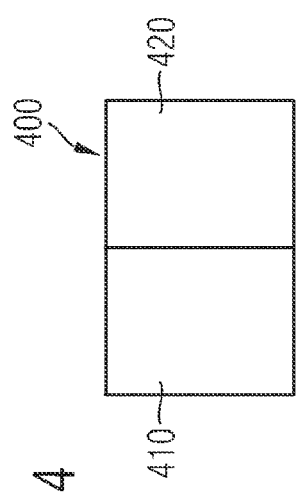
FIG. 4 illustrates one embodiment of an integrated circuit including a semiconductor device with gate trench transistor cells and a third trench between two of the gate trench transistor cells.

FIG. 4 illustrates one embodiment of an integrated circuit 400. The integrated circuit 400 includes a semiconductor device 410 with transistor cells and a third trench between two transistor cells, e.g. one of the embodiments described above with reference to FIGS. 1A to 3 and further circuit elements 420 such as e.g. a resistors, capacitors, transistors.

Figure 5B:
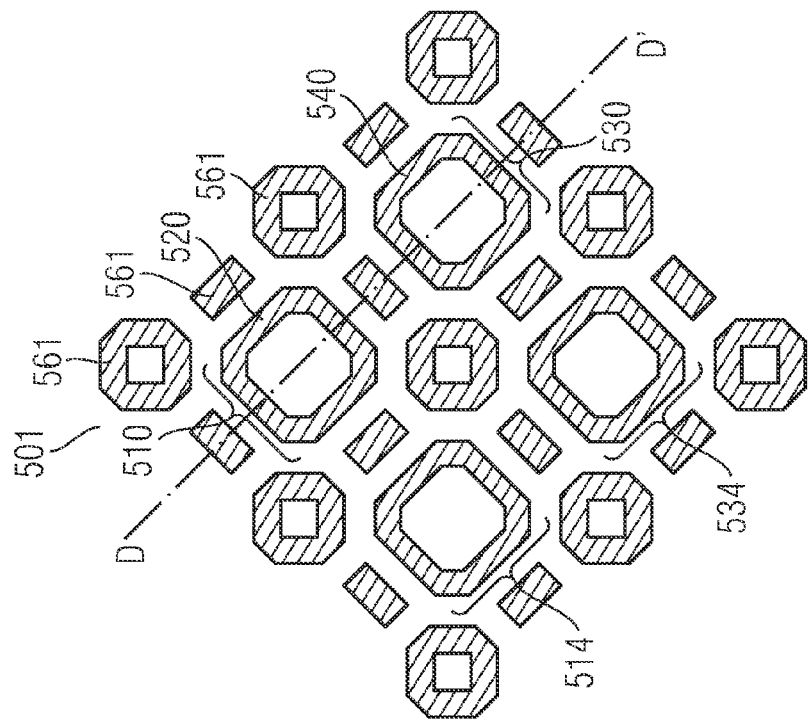
FIG. 5B illustrates a top-view on a layout of a gate trench transistor cell field including trench segments surrounding each one of the trench gate transistor cells.
Figure 5A:
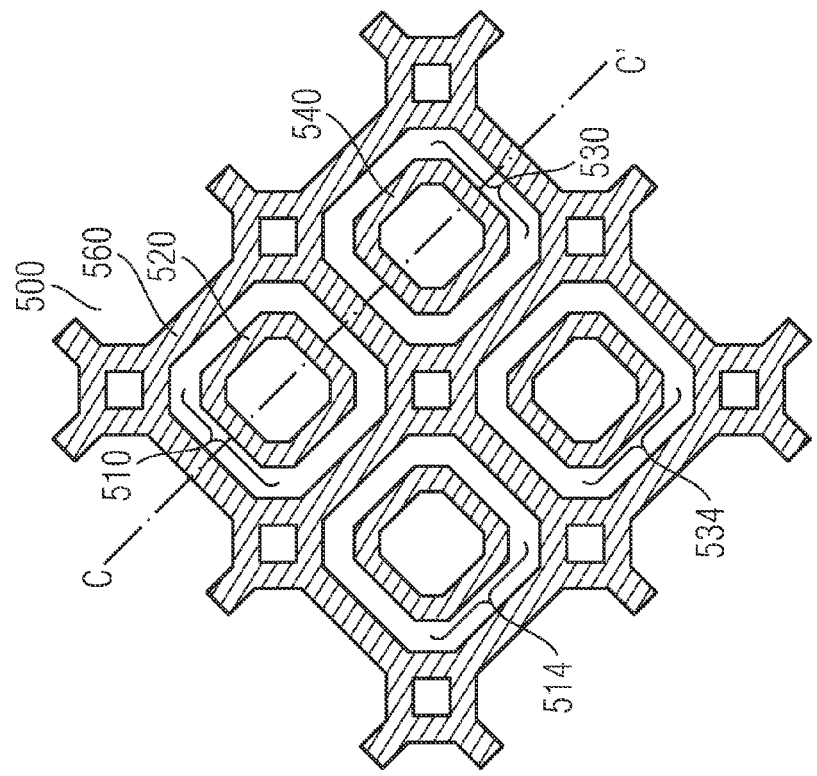
FIG. 5A illustrates a top-view on a layout of a gate trench transistor cell field including a continuous third trench surrounding each one of the trench gate transistor cells.

FIG. 5A illustrates a top-view of a layout of a transistor cell array 500. A first trench 520 of a first transistor cell 510 is separated from a second trench 540 of a second transistor cell 530 by a third trench 560. The third trench 560 is contiguous and surrounds the first and second transistor cells 510, 530. The cross-sectional views illustrated in FIGS. 1A to 1E are for example located along the cross-section defined by the line CC'.

One embodiment of the transistor cell array 500 includes a third transistor cell 514 and a fourth transistor cell 534, also separated from the first and second transistor cells 510, 530 by the third trench 560. One embodiment of the transistor cell array 500 includes a periodic continuation of the first to fourth transistor cells 510, 530, 514, 534 and the third trench 560.

FIG. 5B illustrates a top-view of a layout of a transistor cell array 501. The first trench 520 of the first transistor cell 510 is separated from the second trench 540 of the second transistor cell 530 by a third trench 561. The third trench 561 includes a plurality of trench segments surrounding the first and second transistor cells 510, 530. The cross-sectional views illustrated in FIGS. 1A to 1E are for example located along the cross-section defined by the line DD'.

One embodiment of the transistor cell array 501 includes a third transistor cell 514 and a fourth transistor cell 534, also separated from the first and second transistor cells 510, 530 by the third trench 561, respectively. One embodiment of the transistor cell array 501 includes a periodic continuation of the first to fourth transistor cells 510, 530, 514, 534 and the third trench 561.

The two-dimensional views of FIGS. 5A and 5B illustrate two examples of a two-dimensional pattern of the first transistor cell 510, the second transistor cell 530, and the third trench 560. The first and second trenches 520, 540 may be shaped as stripes, resulting in a striped pattern of the transistor cell array. The first and second trenches 520, 540 may be also shaped in a hexagonal form, resulting in a honeycomb pattern of the transistor cell array.

Figure 6:
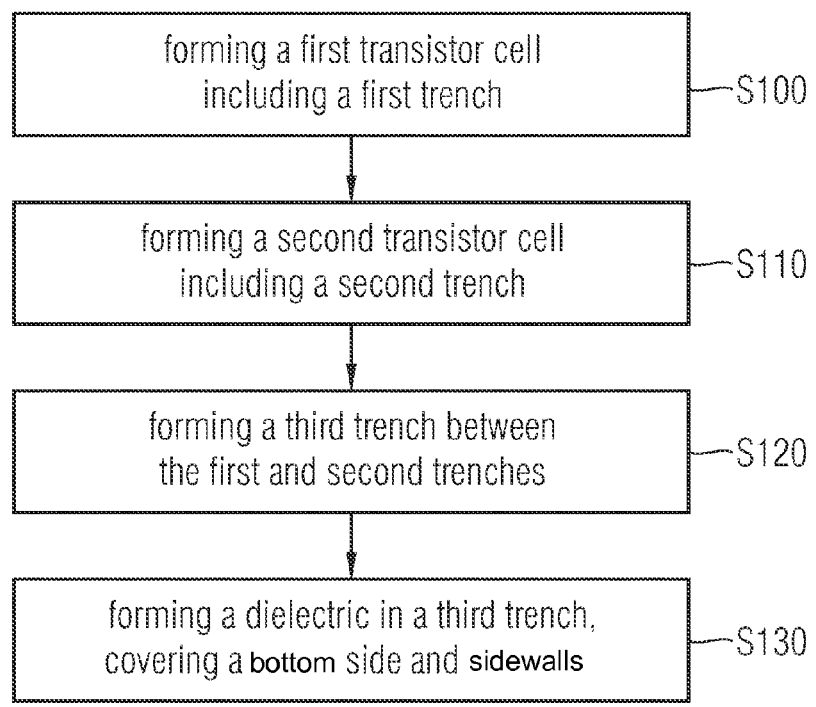
FIG. 6 illustrates one embodiment of a process flow of manufacturing a semiconductor device including trench gate transistor cells and a third trench between two of the trench gate transistor cells.

FIG. 6 illustrates a simplified process flow according to one embodiment of a method of manufacturing of a semiconductor device.

Process feature S100 includes forming a first transistor cell including a first gate electrode in a first trench.

Process feature S110 includes forming a second transistor cell including a second gate electrode in a second trench, wherein the first and the second gate electrodes are electrically connected.

Process feature S120 includes forming a third trench between the first and second trenches, wherein the third trench extends deeper into a semiconductor body from a first side than the first and second trenches.

Process feature S130 includes forming a dielectric in the third trench covering a bottom side and sidewalls of the third trench.

FIGS. 7A to 7D illustrate cross-sectional views of a semiconductor body 605 during processing according to one embodiment of a method of manufacturing a semiconductor device.

Figure 7A:
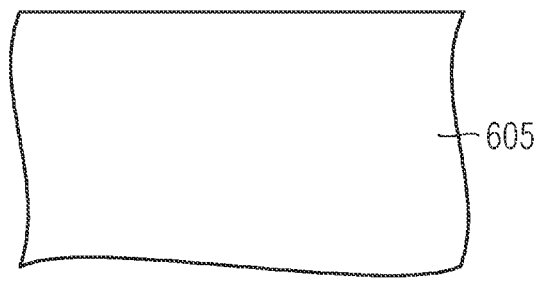
FIGS. 7A to 7D illustrate cross-sectional views of a semiconductor body at different states during manufacturing a semiconductor device including trench gate transistor cells and a third trench between two of the transistor cells.

FIG. 7A illustrates a cross-sectional view of the semiconductor body 605.

Figure 7B:
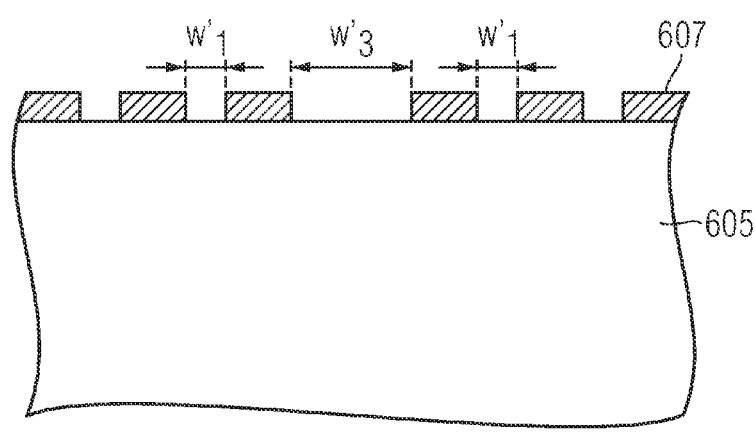

Referring to the schematic cross-sectional view of the semiconductor body illustrated in FIG. 7B, a patterned mask 607 is formed on a first side of the semiconductor body 605, e.g. by lithographic patterning of a mask layer. The patterned mask 607 includes openings having different widths $w_1'$ and $w_3'$. The widths $w_1'$ and $w_3'$ are appropriately chosen such that trench widths $w_1$ and $w_3$, and trench depths $d_1$ and $d_3$ result during further processing. When following the above processes, trenches of different widths and depths can be simultaneously formed.

In one embodiment the patterned mask 607 is formed by depositing a layer of photo resist on the first side of the semiconductor body 605. After baking and mask alignment, exposure and development follow and result in the patterned mask 607. The photo resist may be a positive or a negative resist. The exposure may be done with ultraviolet (UV) light, for example.

Figure 7C:
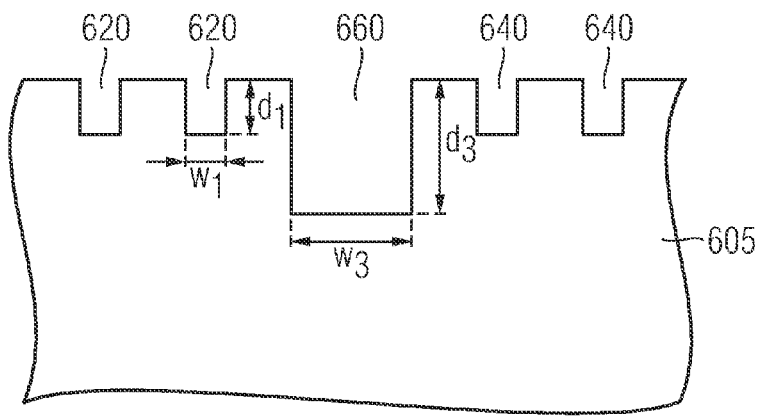

Referring to the schematic cross-sectional view of the semiconductor body 605 illustrated in FIG. 7C, first to third trenches 620, 640, 660 are formed, e.g. by etching through the patterned mask 607. In one embodiment etching is one of wet chemical etching, dry chemical etching, and physical etching. In one embodiment the etching is anisotropic using e.g. an alkaline etch solution.

In one embodiment the first trenches 620, the second trenches 640, and the third trench 660 are formed by etching. The depth of the third trench 660 is $d_3$ and the width of the third trench 660 is $w_3$. The first and second trenches 620, 640 have a depth $d_1$ and a width $w_1$. The depth $d_3$ and the width $w_3$ of the third trench 660 are greater than the depth $d_1$ and the width $w_1$ of the first and second trenches 620, 640, respectively.

Figure 7D:
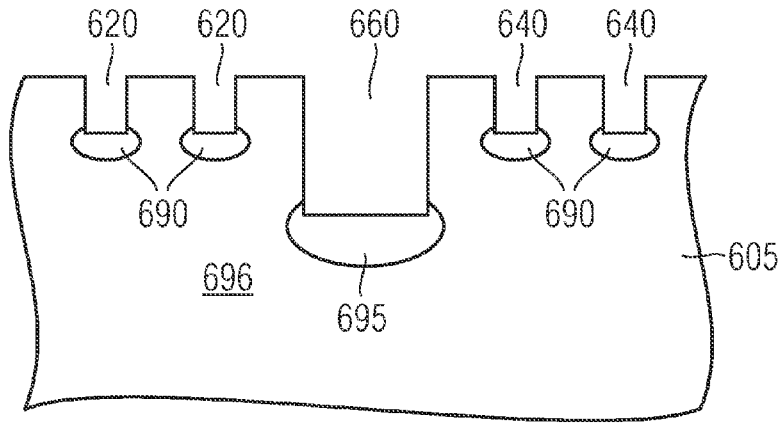

Referring to the schematic cross-sectional view of the semiconductor body 605 illustrated in FIG. 7D, dopants are introduced through a bottom side of the first and second trenches 620, 640 and the third trench 660, respectively. According to one embodiment, a conductivity type of the dopants introduced through the bottom side of the first and second trenches 620, 640 is opposite to the conductivity type of the dopants introduced through the bottom side of the third trench 660, e.g. manufactured by masked ion implantations.

The bottom side of the third trench 660 adjoins a first semiconductor region 695 of the first conductivity type including a net doping concentration higher than the net doping concentration in a surrounding part of a drift zone 696. A conductivity type of the first semiconductor region 695 may be equal to the conductivity type of the drift zone 696.

The bottom side of each of the first and second trenches 620, 640 adjoins a second semiconductor region 690 of the second conductivity type including a net doping concentration higher than the net doping concentration in a surrounding part of the drift zone 696. A conductivity type of the second semiconductor region 690 may be opposite to the conductivity type of the drift zone 696.

The dopants may be introduced by implanting them through the bottom sides of the trenches. Alternatively or in addition, the dopants may be introduced by lining bottom sides of the trenches with a diffusion source, e.g. a highly doped silicon glass and thermally diffusing them through the bottom sides of the trenches.

In one embodiment dopants are introduced through the bottom side of the third trench 660, but not through the bottom side of the first and second trenches 620, 640. In another embodiment dopants are only introduced through the bottom side of the first and second trenches 620, 640, but not through the bottom side of the third trench 660. In yet another embodiment, the dopants are introduced through the first to third trenches 620, 640, 660.

After introducing the dopants through the bottom side of the trenches, the third trench 660 may be filled with a third dielectric or with a third dielectric and a conductive material. The first and second trenches 620, 640 may be filled with a dielectric and a gate electrode. Before and/or in between and/or following the process features described with reference to FIGS. 7A to 7D, transistor cells may be formed as illustrated in FIGS. 1A to 1E, FIGS. 2A and 2B, FIG. 3, FIG. 4, and FIGS. 5A and 5B.

Figure 8:
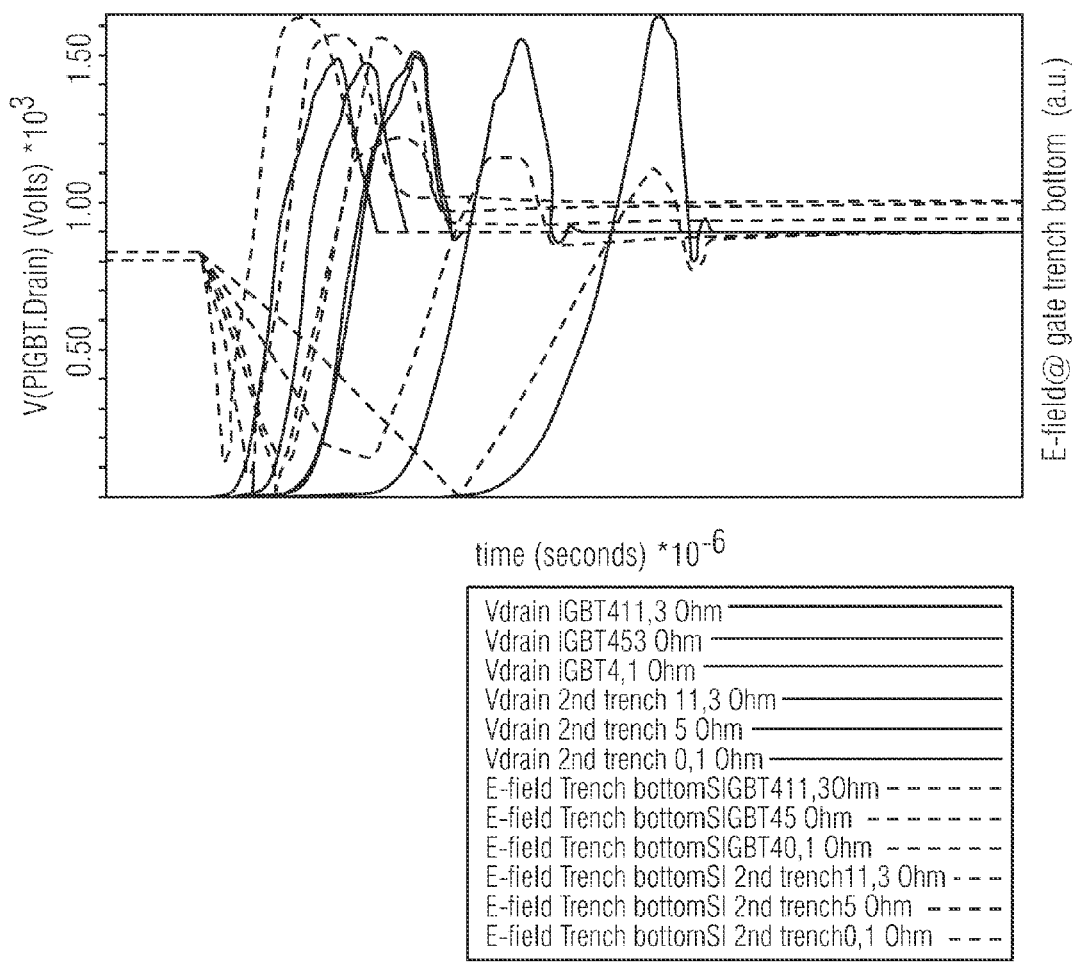
FIG. 8 is a graph illustrating simulation results of collector-emitter voltage and electric field strength at a bottom side of a gate trench at different switching conditions.

FIG. 8 is a graph illustrating simulation results of IGBT collector-emitter voltages (solid lines referring to left Y-axis) and electric field strengths (broken lines referring to right Y-axis) at a bottom side of IGBT gate trenches at different switching conditions. Whereas three solid (broken) line curves to the left Y-axis refer to an n-channel IGBT having a floating p-type region between IGBT cells, i.e. an IGBT lacking a third trench 160, three solid (broken) line curves to the right Y-axis refer to an n-channel IGBT including a third trench 160 between IGBT cells similar to the embodiments illustrated in FIGS. 1A to 1E. Arrangement of the third trench between IGBT cells allows for a reduction of the electric field strength at the bottom side as demonstrated by peak values of the electric field strength at different switching conditions.

In one embodiment the first conductivity type is n-type and the second conductivity type is p-type. In another embodiment the first conductivity type is p-type and the second conductivity type is n-type.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
   a first transistor cell including a first gate electrode in a first trench;
   a second transistor cell including a second gate electrode in a second trench, wherein the first and second gate electrodes are electrically connected;
   a third trench between the first and second trenches, wherein the third trench extends deeper into a semiconductor body from a first side of the semiconductor body than the first and second trenches; and
   a dielectric in the third trench covering a bottom side and walls of the third trench,
   wherein a thickness of the dielectric lining a wall of the third trench at a vertical level coinciding with a gate dielectric in the first and second trenches is greater than a thickness of the gate dielectric in the first and second trenches.

2. The semiconductor device of claim 1, wherein the third trench is wider at the first side than the first and second trenches.

3. The semiconductor device of claim 1, wherein a depth of the first and second trenches equals $d_1$.

4. The semiconductor device of claim 1, wherein the semiconductor body includes a drift zone of a first conductivity type adjoining a bottom side of a body region of a second conductivity type complementary to the first conductivity type; and wherein
   a first semiconductor region of the first conductivity type including a net doping concentration higher than the drift zone adjoins a bottom side of the third trench.

5. The semiconductor device of claim 1, wherein the semiconductor body includes a drift zone of a first conductivity type adjoining a bottom side of a body region of a second conductivity type complementary to the first conductivity type; and wherein
a second semiconductor region of the second conductivity type including a net doping concentration higher than the drift zone adjoins a bottom side of the first and second trenches.

6. The semiconductor device of claim 1, wherein the semiconductor body includes a drift zone of a first conductivity type adjoining a bottom side of a body region of a second conductivity type complementary to the first conductivity type; and wherein
a first semiconductor region including a net doping concentration higher than the drift zone adjoins a bottom side of the third trench; and
a second semiconductor region of a conductivity type opposite to the first semiconductor region and including a net doping concentration higher than the drift zone adjoins a bottom side of the first and second trenches.

7. The semiconductor device of claim 1, wherein each one of the first and second trenches has a width $w_1$, the third trench has a width $w_3$, and $w_1$ ranges between $0.05 \times w_3$ and $w_3$.

8. The semiconductor device of claim 1, further comprising a fourth trench between transistor cells of the semiconductor device, wherein a depth $d_4$ of the fourth trench is greater than a depth $d_1$ of the first and second trenches, and the depth $d_4$ differs from a depth $d_3$ of the third trench.

9. The semiconductor device of claim 1, wherein source regions adjoin only the first and second trenches with respect to the first to third trenches.

10. The semiconductor device of claim 1, wherein the third trench is contiguous and surrounds the first transistor cell.

11. The semiconductor device of claim 1, wherein the third trench includes a plurality of trench segments surrounding the first transistor cell.

12. The semiconductor device of claim 1, wherein each one of the first and second trenches is shaped as one of a stripe and a polygon.

13. An integrated circuit including the semiconductor device of claim 1.

14. The semiconductor device of claim 1, wherein each one of the first and second trenches has a depth $d_1$ and a width $w_1$, and wherein a depth $d_3$ of the third trench ranges between $d_1+0.5$ μm and $d_1+4$ μm.

15. The semiconductor device of claim 14, wherein $d_1$ ranges between 1 μm and 8 μm.

16. The semiconductor device of claim 1, wherein the third trench further includes a conductive material.

17. The semiconductor device of claim 16, wherein the conductive material is electrically floating.

18. The semiconductor device of claim 16, wherein the conductive material is electrically connected to the first and second gate electrodes.

19. The semiconductor device of claim 16, wherein each one of the first and second transistor cells includes a source electrode, and wherein the conductive material of the third trench is electrically connected to the source electrode of the first and second transistor cells.

20. A method of manufacturing a semiconductor device, comprising:
forming a first transistor cell including a first gate electrode in a first trench;
forming a second transistor cell including a second gate electrode in a second trench, wherein the first and second gate electrodes are electrically connected;
forming a third trench between the first and second trenches, wherein the third trench extends deeper into a semiconductor body from a first side of the semiconductor body than the first and second trenches; and
forming a dielectric in the third trench covering a bottom side and sidewalls of the third trench,
wherein forming the first, second and third trenches includes forming a patterned mask at the first side, wherein the patterned mask includes a first type of opening having a greater lateral width than a second type of opening, and etching the first and second trenches through the second type of opening and the third trench through the first type of opening.

21. The method of claim 20, further comprising filling up the third trench with at least one dielectric material.

22. The method of claim 20, further comprising introducing dopants through a bottom side of the third trench into the semiconductor body before filling up the third trench.

23. The method of claim 20, further comprising introducing dopants through a bottom side of the first and second trenches into the semiconductor body before filling up the first and second trenches.

24. A method of manufacturing a semiconductor device, comprising:
forming a first transistor cell including a first gate electrode in a first trench;
forming a second transistor cell including a second gate electrode in a second trench, wherein the first and second gate electrodes are electrically connected;
forming a third trench between the first and second trenches, wherein the third trench extends deeper into a semiconductor body from a first side of the semiconductor body than the first and second trenches;
forming a dielectric in the third trench covering a bottom side and sidewalls of the third trench; and
introducing dopants through a bottom side of the third trench into the semiconductor body before filling up the third trench.

25. A semiconductor device, comprising:
a first transistor cell including a first gate electrode in a first trench;
a second transistor cell including a second gate electrode in a second trench, wherein the first and second gate electrodes are electrically connected;
a third trench between the first and second trenches, wherein the third trench extends deeper into a semiconductor body from a first side of the semiconductor body than the first and second trenches; and
a dielectric in the third trench covering a bottom side and walls of the third trench,
wherein the semiconductor body includes a drift zone of a first conductivity type adjoining a bottom side of a body region of a second conductivity type complementary to the first conductivity type,
wherein a second semiconductor region of the second conductivity type including a net doping concentration higher than the drift zone adjoins a bottom side of the first and second trenches.

* * * * *